United States Patent
King et al.

(10) Patent No.: US 10,566,485 B2
(45) Date of Patent: *Feb. 18, 2020

(54) SOLAR CELLS HAVING A TRANSPARENT COMPOSITION-GRADED BUFFER LAYER

(75) Inventors: Richard R. King, Thousand Oaks, CA (US); Christopher M. Fetzer, Valencia, CA (US); Peter C. Colter, Canyon Country, CA (US)

(73) Assignee: THE BOEING COMPANY, Chicago, IL (US)

(*) Notice: Subject to any disclaimer, the term of this patent is extended or adjusted under 35 U.S.C. 154(b) by 16 days.

This patent is subject to a terminal disclaimer.

(21) Appl. No.: 13/555,725

(22) Filed: Jul. 23, 2012

(65) Prior Publication Data

US 2012/0285524 A1  Nov. 15, 2012

Related U.S. Application Data

(62) Division of application No. 10/868,080, filed on Jun. 15, 2004, now Pat. No. 8,227,689.

(51) Int. Cl.
*H01L 31/00* (2006.01)
*H01L 31/0687* (2012.01)
(Continued)

(52) U.S. Cl.
CPC ...... *H01L 31/0687* (2013.01); *H01L 31/0735* (2013.01); *H01L 31/1852* (2013.01); *Y02E 10/544* (2013.01); *Y02P 70/521* (2015.11)

(58) Field of Classification Search
CPC ............. H01L 31/0687; H01L 31/0735; H01L 31/852; Y02E 10/544
(Continued)

(56) References Cited

U.S. PATENT DOCUMENTS 5,223,043 A  6/1993 Olson et al.
5,689,123 A  11/1997 Major et al.
(Continued)

FOREIGN PATENT DOCUMENTS

JP  03285363 A  * 12/1991

OTHER PUBLICATIONS

Dimroth et al. ("25.5% Efficient Ga0.35In0.65P/Ga0.83In0.17AS Tandem Solar Cells Grown on GaAs Substrates," IEEE Electron Device Letters, vol. 21, No. 5, May 2000.
(Continued)

*Primary Examiner* — Shannon M Gardner
(74) *Attorney, Agent, or Firm* — MH2 Technology Law Group LLP

(57) ABSTRACT

A solar cell includes a first layer having a first-layer lattice parameter, a second layer having a second-layer lattice parameter different from the first-layer lattice parameter, wherein the second layer includes a photoactive second-layer material; and a third layer having a third-layer lattice parameter different from the second-layer lattice parameter, wherein the third layer includes a photoactive third-layer material. A transparent buffer layer extends between and contacts the second layer and the third layer and has a buffer-layer lattice parameter that varies with increasing distance from the second layer toward the third layer, so as to lattice match to the second layer and to the third layer. There may be additional subcell layers and buffer layers in the solar cell.

9 Claims, 6 Drawing Sheets

US 10,566,485 B2

Page 2

(51) Int. Cl.
*H01L 31/18* (2006.01)
*H01L 31/0735* (2012.01)

(58) Field of Classification Search
USPC .......................................................... 136/261
See application file for complete search history.

(56) References Cited

U.S. PATENT DOCUMENTS

| | | |
|---|---|---|
| 6,100,546 A | 8/2000 | Major et al. |
| 6,130,147 A | 10/2000 | Major et al. |
| 6,255,580 B1 | 7/2001 | Karam et al. |
| 6,281,426 B1 | 8/2001 | Olson et al. |
| 6,316,715 B1 | 11/2001 | King et al. |
| 6,340,788 B1 | 1/2002 | King et al. |
| 6,660,928 B1 | 12/2003 | Patton et al. |
| 2004/0065363 A1 | 4/2004 | Fetzer et al. |
| 2004/0079408 A1 | 4/2004 | Fetzer et al. |

OTHER PUBLICATIONS

Lao, "Modulator Driver and Photoreceiver for 20Gb/s Optic-Fiber Links", vol. 16, No. 8, (1998) pp. 1491-1492.
Suzuki, "Solar Energy Materials and Solar Cells", 50 (1998) pp. 289-303).
Said, et al., ("High quality relaxed SiGe epitaxial layers for solar cell application", Thin Solid Films, 337 (1999), pp. 85-89).

\* cited by examiner

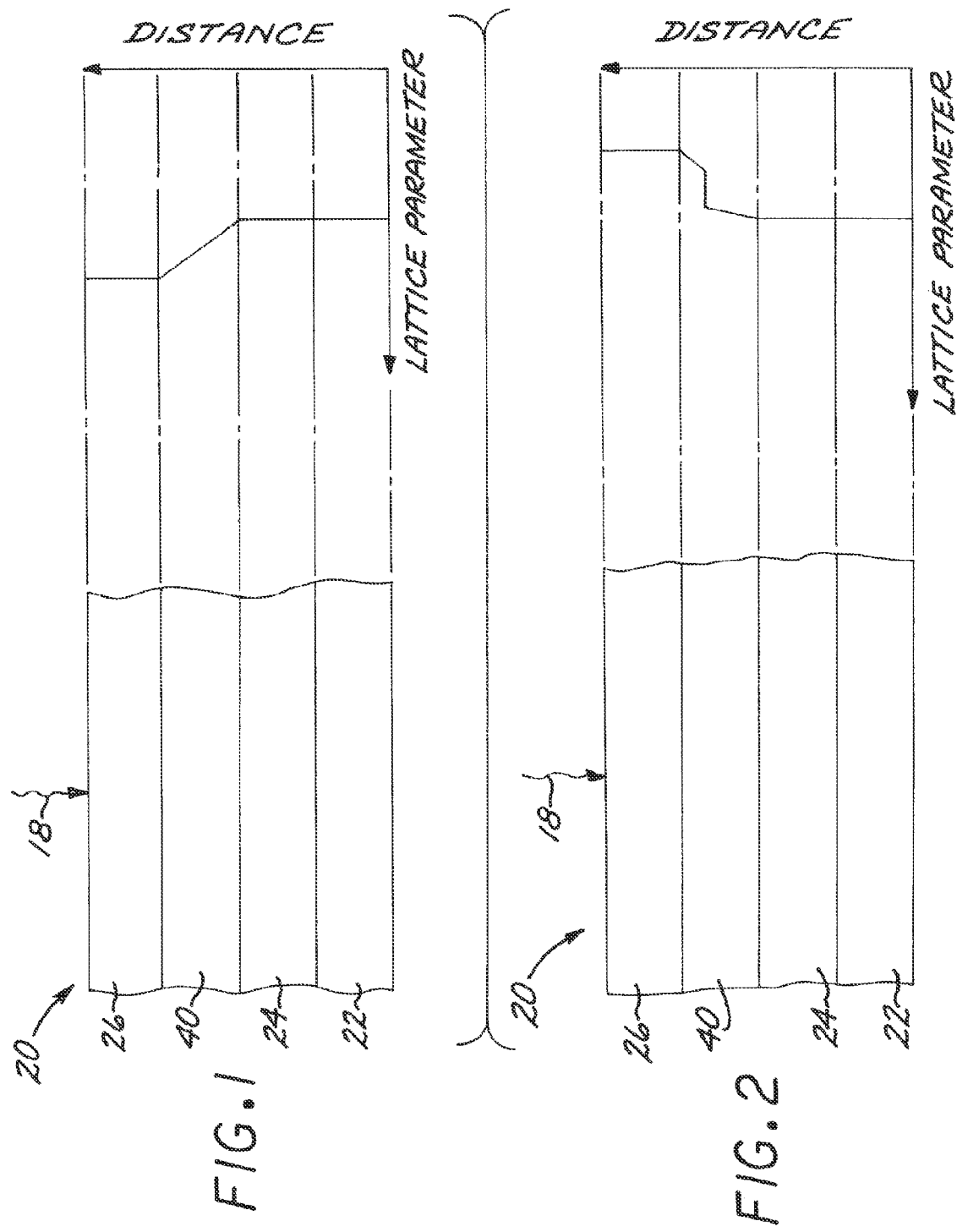

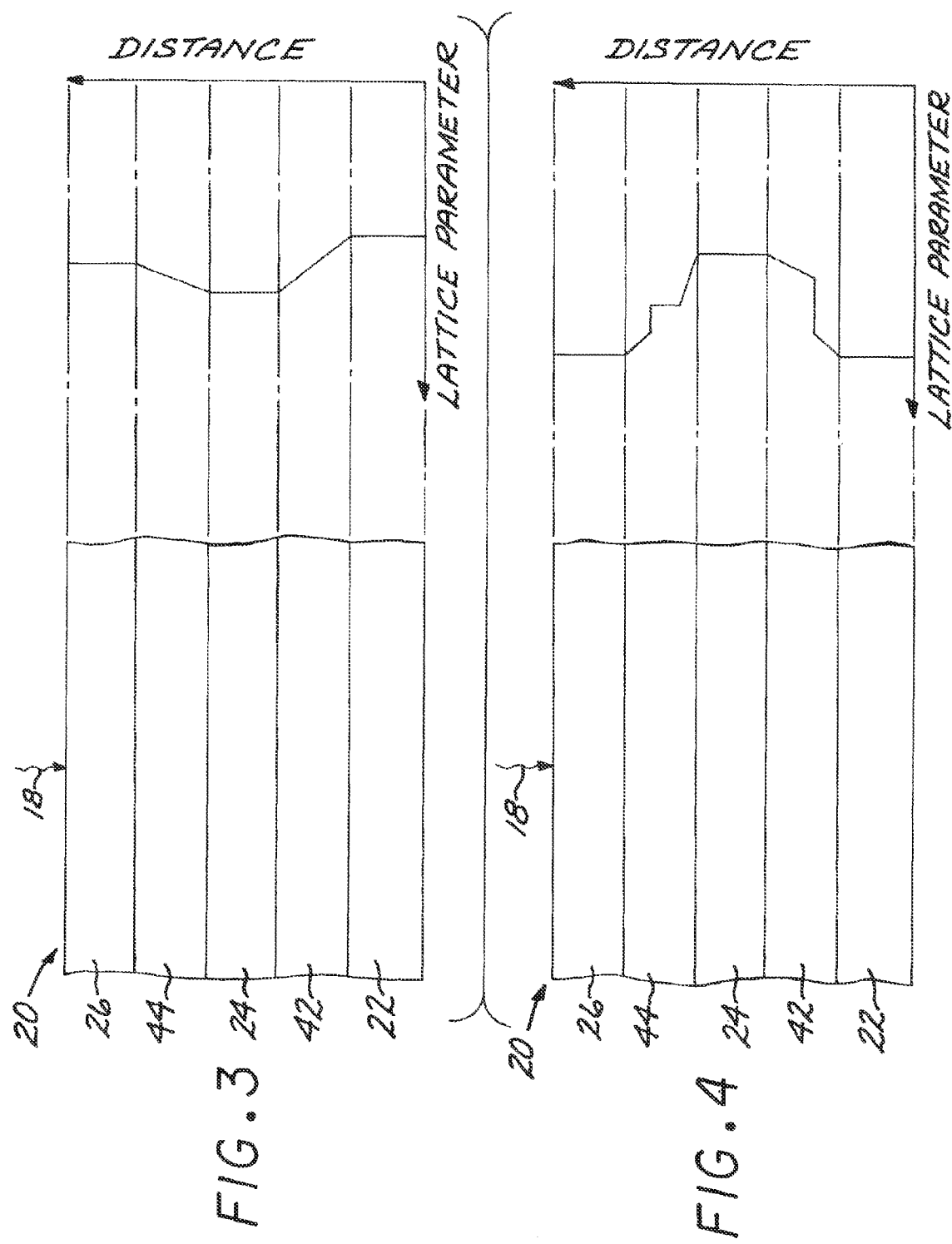

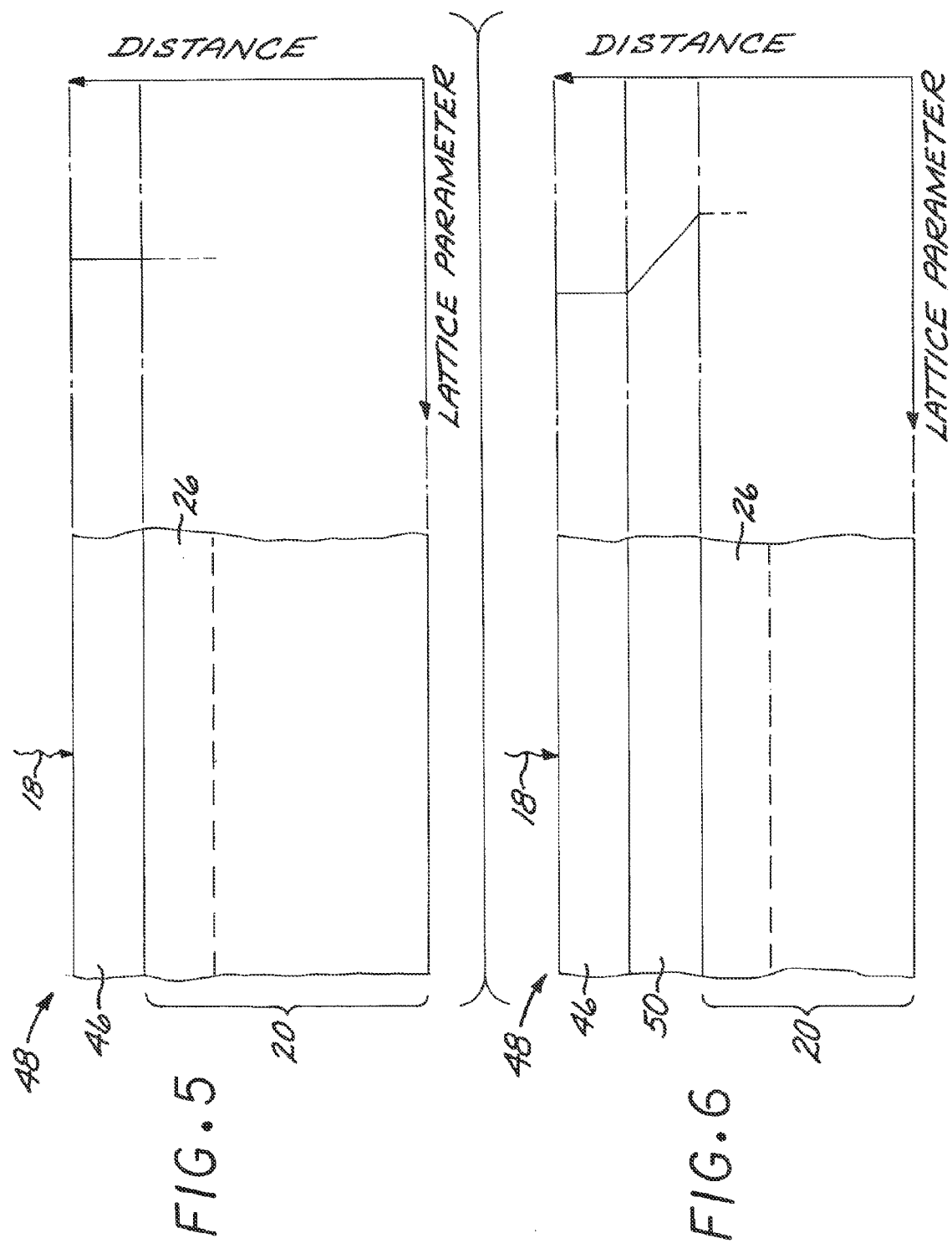

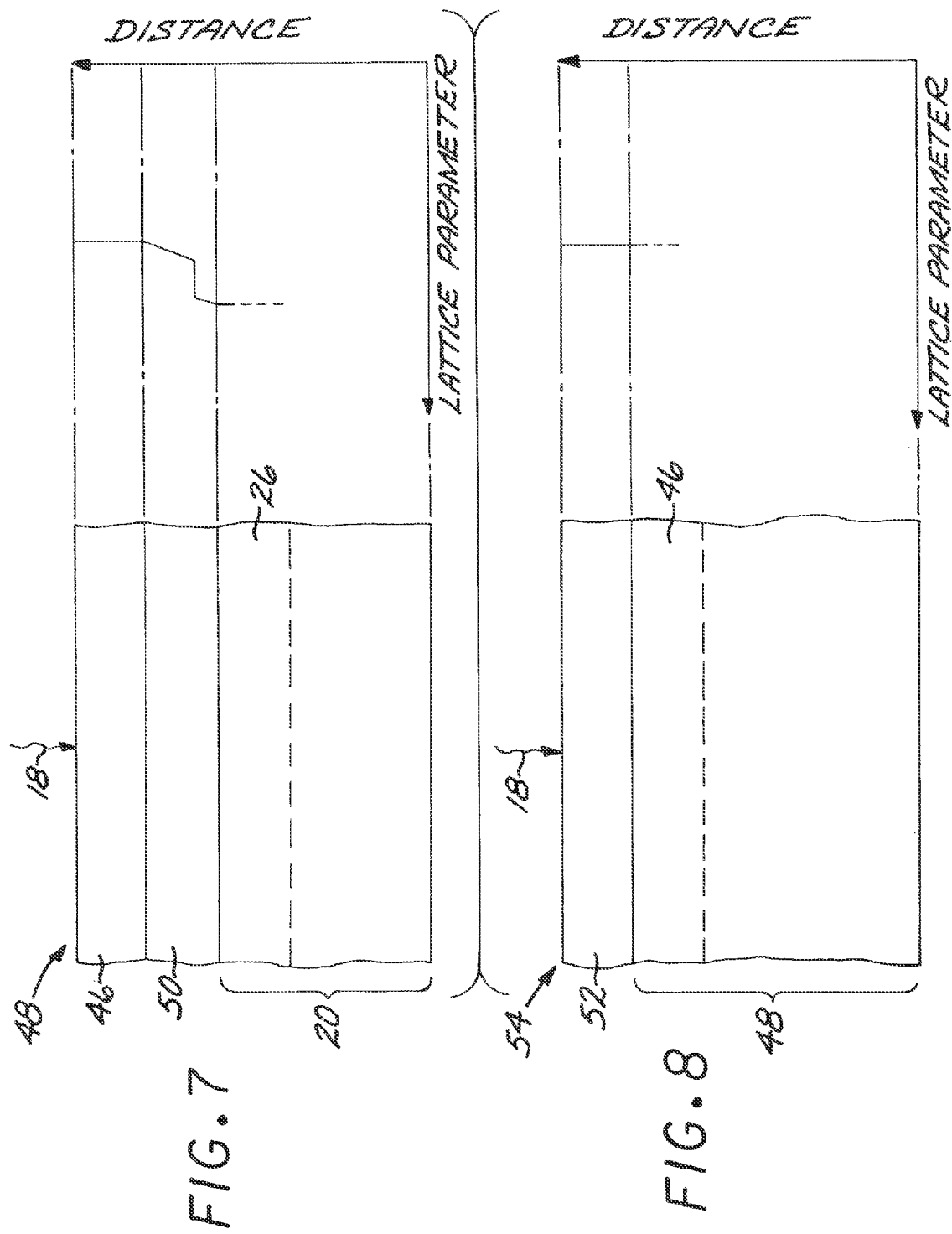

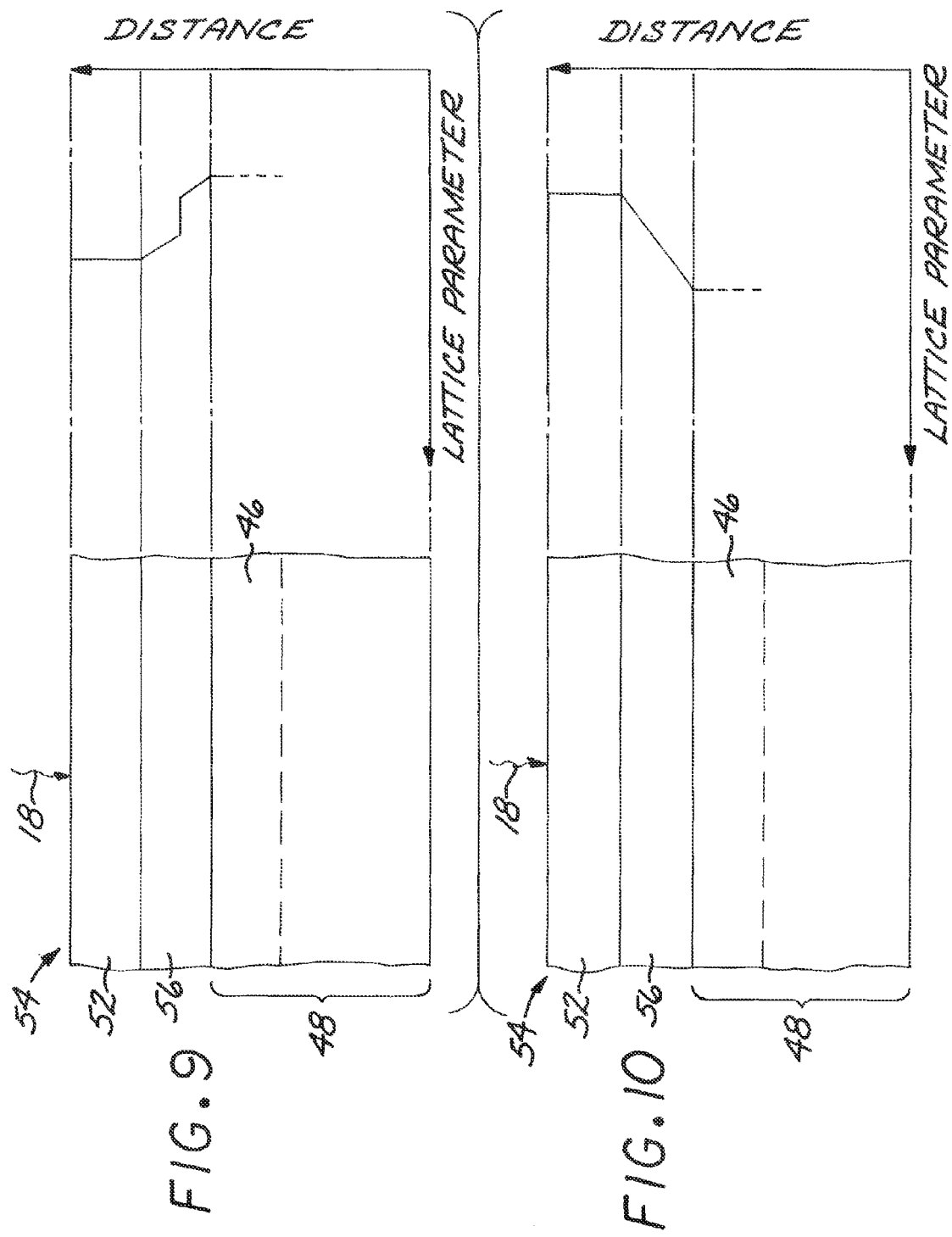

SOLAR CELLS HAVING A TRANSPARENT COMPOSITION-GRADED BUFFER LAYER

CROSS REFERENCE TO RELATED APPLICATIONS

This application is a divisional application of patent application Ser. No. 10/868,080 filed Jun. 15, 2004, entitled "SOLAR CELLS HAVING A TRANSPARENT COMPOSITION-GRADED BUFFER LAYER," now allowed and incorporated herein by reference in its entirety.

This invention was made with Government support under Contract No. F29601-98-2-0207 awarded by the United States Air Force. The Government has certain rights in this invention.

The present invention generally relates to semiconductor materials and, more specifically, to solar cells.

BACKGROUND OF THE INVENTION

A solar cell is a photovoltaic (PV) device having one or more photovoltaic junctions. Each junction is formed by a photovoltaic semiconductor layer. At each junction, incident light energy, and specifically solar energy, is converted to electrical energy through the photovoltaic effect.

The interest in solar cells has been increasing due to concerns regarding pollution and limited available resources. This interest has been for both terrestrial and non-terrestrial applications. In space applications, the use of nuclear or battery power greatly increases a spacecraft's payload for a given amount of required power to operate the satellite. Increasing the payload of a spacecraft in this manner increases the cost of a launch more than linearly. With the ready availability of solar energy in space for a spacecraft such as a satellite, the conversion of solar energy into electrical energy may be a good alternative to an increased payload.

The cost per watt of electrical power generation capacity of photovoltaic systems inhibits their widespread use in terrestrial applications. The conversion efficiency of sunlight to electricity may be critically important for terrestrial PV systems, since increased efficiency usually results in a reduction of related electricity generation system components (such as cell area, module or collector area, support structures, and land area) for a required power output of the system. For example, in concentrator solar cell systems which concentrate sunlight from around 2 to around 2000 times onto the solar cell, an increase in efficiency typically results in a proportionate reduction of an area comprising expensive concentrating optics.

To increase the electrical power output of such cells, multiple subcells or layers having different energy bandgaps have been stacked so that each subcell or layer can absorb a different part of the wide energy distribution in the sunlight. This arrangement is advantageous, since each photon absorbed in a subcell corresponds to one unit of charge that is collected at the subcell operating voltage, which is approximately linearly dependent upon the band gap of the semiconductor material of the subcell. Since the output power is the product of voltage and current, an ideally efficient solar cell would have a large number of subcells, each absorbing only photons of energy negligibly greater than its band gap.

The most efficient and therefore dominant multijunction (MJ) PV cell technology is the GaInP/Ga(In)As/Ge cell structure. Here the use of parentheses in the Ga(In)As middle subcell material indicates that the incorporation of indium in the middle cell is optional, so that the composition of the middle cell may be either GaAs or GaInAs. These monolithic cells may be grown lattice-matched to GaAs or Ge, and may have only the top two junctions active with an inactive Ge substrate (2-junction or 2J cells), or all three junctions may be active (3-junction or 3J cells). While variations on this material system, such as AlGaInP or lattice-mismatched GaInP top cells, might provide a more ideal match of band gaps to the solar spectrum, practical considerations have indicated that lattice-matched GaInP is preferred for large-scale production.

In monolithic, series-interconnected, 2-junction and 3-junction GaInP/Ga(In)As/Ge solar cells, it is desirable for the GaInP top subcell to have nearly the same photogenerated current density as the Ga(In)As subcell. If the currents are different, the subcell with the lowest photogenerated current will limit the current through all of the series-interconnected subcells in the multijunction (MJ) cell, and excess photogenerated current in other subcells is wasted. Limiting the current in this manner results in a severe penalty on the MJ cell efficiency.

At the lattice constant of Ge (or of GaAs) substrates, GaInP grown under conventional conditions has an ordered group-III sublattice and therefore has a band gap which is too low to achieve the desired current match between subcells in the unconcentrated or concentrated AM0 space solar spectrum, the unconcentrated or concentrated AM1.5D and AM1.5G terrestrial solar spectra, and other solar spectra, unless the top subcell is purposely made optically thin, as in U.S. Pat. No. 5,223,043.

Whether in the multiple junction or single junction PV device, a conventional characteristic of PV cells has been the use of a window layer on an emitter layer disposed on the base of the PV cell. The primary function of the window layer is to reduce minority-carrier recombination (i.e., to passivate) the front surface of the emitter. Additionally, the optical properties of the window material must be such that as much light as possible is transmitted to lower cell layers where the photogenerated charge carriers can be collected more efficiently, or if there is substantial light absorption in the window, the minority-carrier lifetime in the window must be sufficiently long for the carriers to be collected efficiently at the p-n junction between the emitter and base of the PV cell. Similarly, a back-surface field (BSF) structure below the PV cell base has been used to reduce minority-carrier recombination at the back surface of the base. As for the window, the BSF structure (referred to here simply as a BSF, for brevity) must have optical properties which allow most of the light that can be used by the subcells beneath the BSF to be transmitted by the BSF, and/or the minority-carrier properties in the BSF must be such that electrons and holes which are generated by light absorption in the BSF are efficiently collected at the p-n junction of the PV cell.

For the multiple-subcell PV device, the efficiency may be limited by the requirement of low-resistance interfaces between the individual cells to enable the generated current to flow from one cell to the next. Accordingly, in a monolithic structure, tunnel junctions have been used to minimize the blockage of current flow. In addition to providing the lowest resistance path possible between adjacent subcells, the tunnel junction should also be transparent to wavelengths of light that can be used by lower subcells in the MJ stack, because of the poor collection efficiency of carriers photogenerated in the tunnel junction region.

These properties are all dependent on the bandgap, doping levels, optical properties, and minority-carrier recombination and diffusion properties of the base, emitter, window, BSF, and tunnel junction layers employed in the device. The semiconductor properties of these cell layers may be enhanced or degraded for a MJ PV device by the choice of substrate orientation.

There exists a need for multijunction solar (photovoltaic) cells with improved power output, efficiency, performance, and cost effectiveness.

SUMMARY OF THE INVENTION

One potential approach to improving the existing triple junction GaInP/Ga(In)As/Ge multijunction solar cell device is to add one or more additional junctions. In an specific case, a junction with an active-layer band gap of approximately 1.0 eV is inserted between the Ga(In)As and Ge active subcells. See U.S. Pat. Nos. 5,689,123; 6,281,426; 6,100,546; 6,130,147; and 6,324,405, all of which are incorporated by reference. The layered combination GaInP/Ga(In)As/1.0 eV subcell/Ge is an example of a four junction or 4J device. The 1.0 eV band gap subcell material is substantially lattice matched; that is, it has a lattice parameter exactly or near exactly that of the underlying and overlying subcell materials. The subcell containing the 1.0 eV material is as described above, including the window, the emitter, the base BSF, and the tunnel junctions. U.S. Pat. No. 6,316,715, which is incorporated by reference, discusses the methodology of incorporating additional junctions to form more-complex five junction (5J) and six junction (6J) devices.

A limitation in the existing 4J, 5J, and 6J devices (and cells with even more junctions) is the requirement of nearly perfect lattice matching of the inserted subcell and the underlying and overlying materials. Any substantial deviation, such as more than about +/−0.1 percent difference, in lattice parameter without proper design to incorporate the change in lattice parameter will result in degradation of the overall efficiency of the solar cell. Another limitation is the reliance on the GaInAsN alloy lattice-matched to the GaAs or Ge layers. The lattice-matched GaInAsN material has poor quality when produced by available techniques. The problem results from the need to incorporate a large amount of nitrogen to achieve the 1.0 eV band gap and the lattice-matched condition simultaneously.

The present invention provides an improved solar (photovoltaic) cell that is most preferably utilized as a multijunction structure. The solar cell offers increased efficiency and performance, with little change in cost, as compared with conventional solar cells.

In accordance with the invention, a solar cell comprises a first layer having a first-layer lattice parameter, a second layer having a second-layer lattice parameter different from the first-layer lattice parameter, wherein the second layer includes a photoactive second-layer material, and a third layer having a third-layer lattice parameter different from the second-layer lattice parameter, wherein the third layer includes a photoactive third-layer material. The first layer may be photoactive or inert to serve only as a substrate. As with all photoactive layers, the second layer typically comprises a plurality of second-layer sublayers, wherein each of the second-layer sublayers has substantially the second-layer lattice parameter.

The lattice mismatches between the layers is accommodated by a graded first buffer layer extending between and contacting the first layer and the second layer and having a first-buffer-layer lattice parameter that increases (or decreases) with increasing distance from the first layer toward the second layer, and a transparent graded second buffer layer extending between and contacting the second layer and the third layer and having a second-buffer-layer lattice parameter that decreases (or increases) with increasing distance from the second layer toward the third layer. The second buffer layer may be of a different composition than the first buffer layer. The grading of the lattice parameters of the buffer layers is accomplished by grading the composition of the buffer layers, as the lattice parameter varies with the composition. As used herein, "transparent" means that the buffer layer transmits light that passes through the photoactive layers above it. "Above" refers to high-indicated layers: the second layer is "above" the first layer. Stated alternatively, "transparent" means that the buffer layer transmits light that passes through higher-indicated photoactive layers.

The lattice parameters of the buffer layers are preferably selected to achieve lattice matching and an epitaxial relation with the layers that they contact at their extremities. For example, the first buffer layer is preferably epitaxial to the first (optionally photoactive) layer on one side, graded in composition through its thickness, and epitaxial to the second (photoactive) layer on the other side. Similarly, the second buffer layer is preferably epitaxial to the second (photoactive) layer on one side, graded in composition through its thickness, and epitaxial to the third (photoactive) layer on the other side. As used herein, "epitaxial" mean that the lattice planes are continuous across the interface between the photoactive layer and the buffer layer, or between two photoactive layers. Additionally, the first buffer layer may be lattice matched to the first (optionally photoactive) layer on one side, graded in composition through its thickness, and lattice matched to the second (photoactive) layer on the other side. Similarly, the second buffer layer may be lattice matched to the second (photoactive) layer on one side, graded in composition through its thickness, and lattice matched to the third (photoactive) layer on the other side.

The use of the graded buffer layer achieves the desired lattice matching and epitaxial relationship through the thickness of the solar cell. This lattice matching and epitaxial relationship is needed to minimize internal stresses and strains, and for good electron movement through the thickness of the solar cell. The graded buffer layer also allows the requirement for lattice matching of the photoactive layers to be relaxed, so that their compositions may be chosen to produce the optimal bandgaps for photoconversion of the incident portions of the solar spectrum. The result is improved performance of the individual subcells, and improved performance of the solar cell.

In one form where the first-buffer-layer lattice parameter increases with increasing distance from the first layer toward the second layer, and the second-buffer-layer lattice parameter decreases with increasing distance toward the third layer, the first layer is a nonphotoactive Ge substrate, the second layer includes $Ga_{1-X}In_XAs$, wherein X is from 0 to 0.53, the third layer includes GaAs, the first buffer layer includes graded GaInAs, and the second buffer layer includes transparent graded AlGaInAs. More preferably, X is from about 0.12 to about 0.37. In another form where the first-buffer-layer lattice parameter decreases with increasing distance from the first layer toward the second layer, and the second-buffer-layer lattice parameter increases with increasing distance toward the third layer, the first layer is a nonphotoactive Ge substrate, the second layer includes SiGe, the third layer includes GaAs, the first buffer layer includes graded SiGe, and the second buffer layer includes transparent graded GaInP(As).

The present approach may be extended to additional junctions and subcells lying above the second and third layers. For example, there may be a fourth layer comprising a photoactive fourth-layer material. If the fourth layer is naturally lattice matched and epitaxial to the third layer, there is no need for a buffer layer between the third layer and the fourth layer. If the fourth layer is naturally lattice mismatched relative to the third layer, the cell is grown with a transparent graded third buffer layer extending between and contacting the third layer and the fourth layer and having a third-buffer-layer lattice parameter that matches that of the third layer where the third buffer layer contacts the third layer and matches that of the fourth layer where the third buffer layer contacts the fourth layer. Similarly, there may be a fifth layer comprising a photoactive fifth-layer material. If the fifth layer is naturally lattice matched and epitaxial to the fourth layer, there is no need for a buffer layer between the fourth layer and the fifth layer. If the fifth layer is naturally lattice mismatched relative to the fourth layer, the cell is grown with a transparent graded fourth buffer layer extending between and contacting the fourth layer and the fifth layer and having a fourth-buffer-layer lattice parameter that matches that of the fourth layer where the fourth buffer layer contacts the fourth layer and matches that of the fifth layer where the fourth buffer layer contacts the fifth layer. Additional photoactive layers may be added overlying the fifth layer using these same principles.

More generally, a solar cell comprises a first layer having a first-layer lattice parameter, and a second layer having a second-layer lattice parameter different from the first-layer lattice parameter. The second layer includes a photoactive second-layer material, while the first layer may be photoactive or may be a non-photoactive substrate. A transparent buffer layer extends between and contacts the first layer and the second layer and has a buffer-layer lattice parameter that increases or decreases as needed with increasing distance from the first layer toward the second layer. The first layer may transparent to wavelengths of light that are photoconverted by the second layer, so that the second layer and the buffer layer may be positioned further from the sun or other source of illumination than the first layer when the solar cell is in service. Conversely, the second layer and the buffer layer may be positioned closer to the sun than the first layer when the solar cell is in service, and in that case the first layer need not be transparent. There may be at least one additional photoactive layer made of a photoactive additional-layer material, either on the same side of the first layer as the second layer so that the first layer is not between the at least one additional photoactive layer and the second layer, or on the opposite side of the first layer from the second layer so that the first layer is between the at least one additional photoactive layer and the second layer. The buffer layer may be made of a buffer-layer material having a minimum bandgap greater than a bandgap of the second layer by at least 50 milli-eV. Other compatible features discussed herein may be used in this embodiment as well, such as the presence of additional photoactive layers.

The present approach achieves lattice matching of the photoactive and buffer layers throughout the stack of layers that defines the solar cell. The compositions of the photoactive layers, and thence their lattice parameters, and are selected according to the bandgap requirements for optimal photoconversion efficiency. The lattice matching is achieved using the composition-graded (and thence lattice-parameter-graded) buffer layers. The compositions of the buffer layers are selected to achieve lattice matching to the adjacent pair of non-buffer layers, including the photoactive layers and also any non-photoactive substrate that may be present.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

BRIEF DESCRIPTION OF THE DRAWINGS

FIG. 1 is a schematic elevational view of a first embodiment of a solar cell, with an associated graph indicating lattice parameter as a function of distance through the solar cell;

FIG. 2 is a schematic elevational view of a second embodiment of a solar cell, with an associated graph indicating lattice parameter as a function of distance through the solar cell;

FIG. 3 is a schematic elevational view of a third embodiment of a solar cell, with an associated graph indicating lattice parameter as a function of distance through the solar cell;

FIG. 4 is a schematic elevational view of a fourth embodiment of a solar cell, with an associated graph indicating lattice parameter as a function of distance through the solar cell;

FIG. 5 is a schematic elevational view of a fifth embodiment of a solar cell, with an associated graph indicating lattice parameter as a function of distance through the solar cell;

FIG. 6 is a schematic elevational view of a sixth embodiment of a solar cell, with an associated graph indicating lattice parameter as a function of distance through the solar cell;

FIG. 7 is a schematic elevational view of a seventh embodiment of a solar cell, with an associated graph indicating lattice parameter as a function of distance through the solar cell;

FIG. 8 is a schematic elevational view of an eighth embodiment of a solar cell, with an associated graph indicating lattice parameter as a function of distance through the solar cell;

FIG. 9 is a schematic elevational view of a ninth embodiment of a solar cell, with an associated graph indicating lattice parameter as a function of distance through the solar cell;

FIG. 10 is a schematic elevational view of a tenth embodiment of a solar cell, with an associated graph indicating lattice parameter as a function of distance through the solar cell;

DETAILED DESCRIPTION OF THE INVENTION

Figure 11:
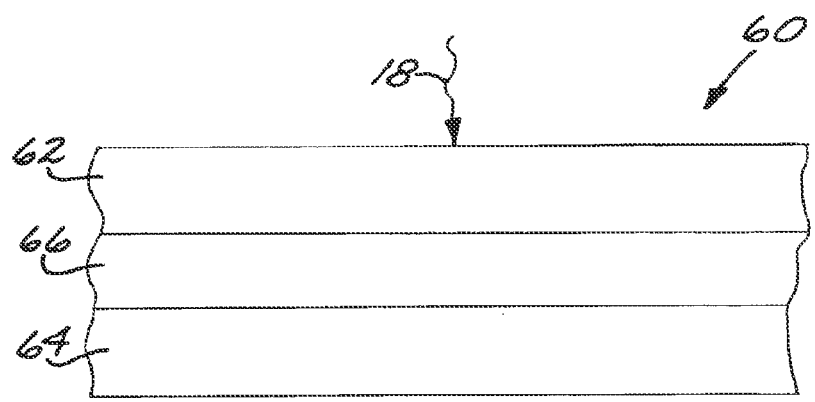
FIG. 11 is a schematic elevational view of an eleventh embodiment of a solar cell.

FIGS. 1-10 depict multijunction solar cells that incorporate the present approach. In each of these multijunction solar cells, sunlight from the sun is incident in a direction 18, and there are electrodes (not shown) to conduct the electrical current generated by the solar cell. When used to compare two layers, "upper" or "above" or "overlying" refers to a layer closer to the sun, and "lower" or "below" or "underlying" refers to a layer further from the sun or other source of illumination.

FIG. 1 depicts a first embodiment of a multijunction solar cell 20. The multijunction solar cell 20 includes a first layer 22 having a first-layer lattice parameter. The first layer 22 may be an inert substrate, or it may be a photoactive layer made of a photoactive first-layer material. The multijunction solar cell 20 further includes a second layer 24 having a second-layer lattice parameter different from the first-layer lattice parameter. The second layer 24 includes a photoactive second-layer material. The multijunction solar cell 20 further includes a third layer 26 having a third-layer lattice parameter different from the second-layer lattice parameter. The third layer includes a photoactive third-layer material.

The photoactive layers, such as the layers 24 and 26, and optionally the layer 22 when including a photoactive material, are each solar subcells. The photoactive material of each of the photoactive layers is selected to have a bandgap and functionality to optimally convert a portion of the solar spectrum to an electrical current. Although it is the common practice, followed here, to describe each of these photoactive layers as a "layer", in actuality each of the photoactive layers includes multiple sublayers. A general photoactive layer includes a BSF sublayer, an overlying and contacting base sublayer, an overlying and contacting emitter sublayer, and an overlying and contacting window sublayer. These sublayers are obtained by properly doping a base-layer material with small amounts of the proper dopants, or may be obtained by the use of other alloy materials doped with small amounts of the proper dopants as described in U.S. Pat. Nos. 6,255,580 and 5,223,043, which are incorporated by reference. The lattice parameter of each of the sublayers is therefore substantially the same, and equal to the lattice parameter of the photoactive layer. There is also a tunnel junction sublayer (not shown) between adjacent photoactive layers. This type of detailed structure of the photoactive layers is described in U.S. Pat. No. 6,660,928, which is incorporated by reference. This detailed structure of the photoactive layers and tunnel junctions is not shown in the figures, to avoid clutter and obscuring the nature of the present invention.

Returning to the discussion of FIG. 1, the multijunction solar cell 20 further includes a transparent graded buffer layer 40 extending between and contacting the photoactive second layer 24 and the photoactive third layer 26. The composition of the graded buffer layer 40 varies such that the graded buffer layer 40 has a buffer-layer lattice parameter that varies, and in this case increases, with increasing distance from the second layer 24 toward the third layer 26. Preferably, the composition of the graded buffer layer 40 is selected so that the lattice of the graded buffer layer 40 is matched to (i.e., has substantially the same value as) and epitaxially related to the second layer 24 where the graded buffer layer 40 contacts the second layer 24; and composition of the graded buffer layer 40 is selected so that the lattice of the graded buffer layer 40 is matched to (i.e., has substantially the same value as) and epitaxially related to the third layer 26 where the graded buffer layer 40 contacts the third layer 26. This lattice matching and epitaxial relation between the graded buffer layer 40 and the layers 24 and 26 on either side of it achieves minimal strain and stress in the neighborhood of the interfaces, and good electron movement between the layers 24, 40, and 26.

To achieve the desired transparency, the graded buffer layer 40 is preferably made of a buffer-layer material having a minimum bandgap greater than a bandgap (or bandgaps) of the layer (or layers) underlying it, here the second layer 24, by at least 50 milli-eV.

The multijunction solar cell 20 of FIG. 2 is like that of FIG. 1, except as discussed next, and the discussion of FIG. 1 is incorporated here. In the embodiment of FIG. 2, the lattice parameter of the graded buffer layer 40 decreases with increasing distance from the second layer 24 toward the third layer 26, because the lattice parameter of the third layer 26 is less than that of the second layer 24. In the embodiment of FIG. 1, on the other hand, the lattice parameter of the graded buffer layer 40 increases with increasing distance from the second layer 24 toward the third layer 26, because the lattice parameter of the third layer 26 is greater than that of the second layer 24. Another difference is that the lattice parameter of the graded buffer layer 40 is depicted in FIG. 1 as smoothly varying, whereas the lattice parameter of the graded buffer layer 40 is depicted in FIG. 2 as varying smoothly over some of the distance between the layers 24 and 26, and also including a stepwise variation. Both smooth and stepwise variations are operable in either embodiment. There may also be some portions of the graded buffer layer 40 where there is no variation of the lattice parameter with distance, although over the entire thickness of the graded buffer layer there may be a net change in the lattice parameter.

The embodiments of FIGS. 1 and 2 illustrate the lattice parameter of the first layer 22 and the second layer 24 as being the same and therefore lattice matched. In many situations of interest, however, the lattice parameter of the first layer 22 and the second layer 24 may be different. In that event, a graded buffer layer, termed the first graded buffer layer 42, is placed between the first layer 22 and the second layer 24. The graded buffer layer 40 between the second layer 24 and the third layer 26 is renamed as the second graded buffer layer 44 in this embodiment. The prior description of the graded buffer layer 40 and its structure is incorporated here as to both of the graded buffer layers 42 and 44.

In the embodiment of FIG. 3, the lattice parameter of the first graded buffer layer 42 increases with increasing distance from the first layer 22 toward the second layer 24, and the lattice parameter of the second graded buffer layer 44 decreases with increasing distance from the second layer 24 toward the third layer 26. In the embodiment of FIG. 4, on the other hand, the lattice parameter of the first graded buffer layer 42 decreases with increasing distance from the first layer 22 toward the second layer 24, and the lattice parameter of the second graded buffer layer 44 increases with increasing distance from the second layer 24 toward the third layer 26. The increases and decreases may be smooth or stepwise, as discussed above. The graded buffer layers 42 and 44 are preferably selected to achieve the lattice matching and epitaxy discussed earlier. Additionally, it is preferred that the lattice parameter of one of the graded buffer layers 42, 44 have a net increase, while the lattice parameter of the other of the graded buffer layers 44, 42 have a net decrease. This balancing of the increase and decrease in the lattice parameters reduces longer-distance strain and stress patterns that would otherwise be present in the multijunction solar cell 20.

In an example of the multijunction solar cell 20 of FIG. 3, the first layer 22 is a nonphotoactive Ge substrate, the second layer 24 includes $Ga_{1-X}In_XAs$, wherein X is from 0 to 0.53, the third layer 26 includes GaAs, the first buffer layer 42 includes graded GaInAs, and the second buffer layer 44 includes transparent graded AlGaInAs.

In an example of the multijunction solar cell 20 of FIG. 4, the first layer 22 is a nonphotoactive Ge substrate, the second layer 24 includes SiGe, the third layer 26 includes GaAs, the first buffer layer 42 includes graded SiGe, and the second buffer layer 44 includes transparent graded GaInP (As).

The multijunction solar cell may further include at least one additional photoactive layer made of a photoactive additional-layer material. FIGS. 5-7 depict embodiments having one additional photoactive layer, which is a fourth layer 46 having a composition different from that of the third layer 26. In each of these embodiments of FIGS. 5-7, the fourth layer 46 is deposited overlying any one of the solar cells 20 of FIGS. 1-4, to form a new multijunction solar cell 48. In the embodiment of FIG. 5, the fourth layer 46 is naturally lattice-matched to the third layer 26 that is at the top of the solar cell 20. In the embodiment of FIG. 6, the lattice parameter of the fourth layer 46 is greater than that of the third layer 26 that is at the top of the solar cell 20. In this case, a third graded buffer layer 50 extends between and contacts the third layer 26 and the fourth layer 46 and has a second-buffer-layer lattice parameter that increases with increasing distance from the third layer 26 toward the fourth layer 46. In the embodiment of FIG. 7, the lattice parameter of the fourth layer 46 is less than that of the third layer 26 that is at the top of the solar cell 20. In this case, the third graded buffer layer 50 extends between and contacts the third layer 26 and the fourth layer 46 and has a second-buffer-layer lattice parameter that decreases with increasing distance from the third layer 26 toward the fourth layer 46. The increases and decreases in the lattice parameter of the third graded buffer layer 50 may be continuous or stepwise, as discussed earlier. The discussion of the structures of the buffer layers 40, 42, and 44 is incorporated here as to the third buffer layer 50.

In an example of the multijunction solar cell 48 of FIG. 5, the first layer 22 is a nonphotoactive Ge substrate, the second layer 24 includes $Ga_{1-X}In_XAs$, wherein X is from 0 to 0.53, the third layer 26 includes GaAs, the fourth layer 46 includes lattice-matched GaInP (so that there is no need for a third buffer layer), the first buffer layer 42 includes graded GaInAs, and the second buffer layer 44 includes transparent graded AlGaInAs.

FIGS. 8-10 depict embodiments having another additional photoactive layer, which is a fifth layer 52 having a composition different from that of the fourth layer 26. In each of these embodiments of FIGS. 8-10, the fifth layer 52 is deposited overlying any one of the solar cells 48 of FIGS. 5-7, to form a new multijunction solar cell 54. In the embodiment of FIG. 8, the fifth layer 52 is naturally lattice-matched to the fourth layer 46 that is at the top of the solar cell 48. In the embodiment of FIG. 9, the lattice parameter of the fifth layer 52 is greater than that of the fourth layer 46 that is at the top of the solar cell 48. In this case, a fourth graded buffer layer 56 extends between and contacts the fourth layer 46 and the fifth layer 52 and has a fourth-buffer-layer lattice parameter that increases with increasing distance from the fourth layer 46 toward the fifth layer 52. In the embodiment of FIG. 10, the lattice parameter of the fifth layer 52 is less than that of the fourth layer 46 that is at the top of the solar cell 48. In this case, the fourth graded buffer layer 56 extends between and contacts the fourth layer 46 and the fifth layer 52 and has a third-buffer-layer lattice parameter that decreases with increasing distance from the fourth layer 46 toward the fifth layer 52. The increases and decreases in the lattice parameter of the fourth graded buffer layer 56 may be continuous or stepwise, as discussed earlier. The discussion of the structures of the buffer layers 40, 42, 44, and 46 is incorporated here as to the fourth buffer layer 56.

Figure 12:
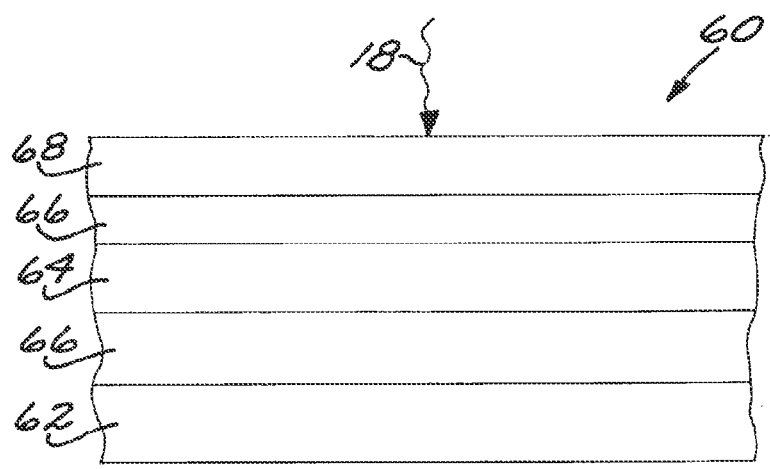
FIG. 12 is a schematic elevational view of a twelfth embodiment of a solar cell.
Figure 13:
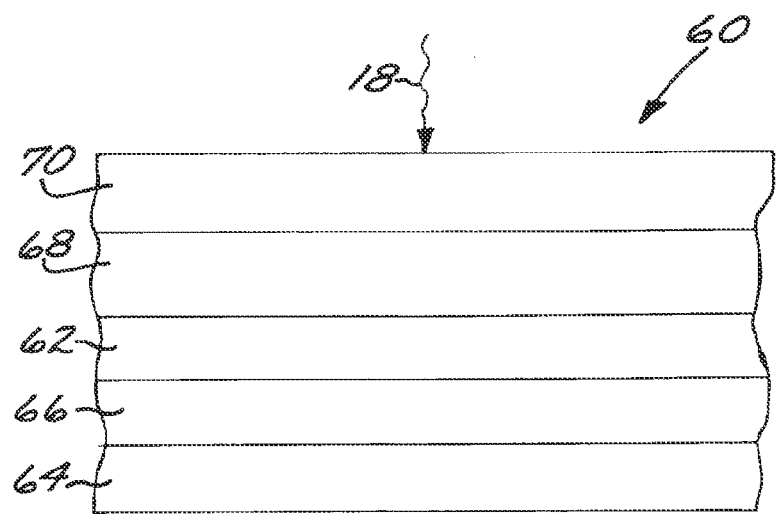
FIG. 13 is a schematic elevational view of a thirteenth embodiment of a solar cell.

FIGS. 11-13 illustrate a solar cell 60 having a first layer 62 with a first-layer lattice parameter. The first layer 62 may be a photoactive layer or a non-photoactive substrate. A second layer 64 has a second-layer lattice parameter different from the first-layer lattice parameter. The second layer 64 is photoactive and includes a photoactive second-layer material. A buffer layer 66 extends between and contacts the first layer 62 and the second layer 64. The buffer layer 66 has a buffer-layer lattice parameter that increases with increasing distance from the first layer 62 toward the second layer 64 in the event that the lattice parameter of the second layer 64 is greater than that of the first layer 62, and decreases with increasing distance from the first layer 62 toward the second layer 64 in the event that the lattice parameter of the second layer 64 is less than that of the first layer 62. Compatible features operable with other embodiments are operable with the embodiments of FIGS. 11-13, and the pertinent discussion is incorporated here.

In the embodiment of FIG. 11, the first layer 62 is closer to the sun or other light source, and thence to the incident sunlight 18, than is the second layer 64, when the solar cell 60 is in service. Consequently, the first layer 62 must be transparent to wavelengths of light that are photoconverted by the second layer 64, whether the first layer 62 is photoactive or not photoactive. In the embodiment of FIG. 12, the first layer 62 is further from the sun or other light source, and thence from the incident sunlight 18, than is the second layer 64, when the solar cell 60 is in service. Consequently, the first layer 62 may be, but need not be, transparent to wavelengths of light that are photoconverted by the second layer 64, whether the first layer 62 is photoactive or not photoactive. Additional solar subcells 68 and 70 may optionally be deposited overlying the second layer 64.

The embodiment of FIG. 13 is based upon that of FIG. 11 with the first layer 62 being a non-photoactive substrate. The embodiment of FIG. 13 further has the additional solar subcell 68, and the additional optional solar subcell 70. In this case, the solar subcell defined by the second layer 64 and its associated buffer layer 66 are on the opposite side of the first-layer substrate 62 from additional solar subcells 68 and 70. That is, the additional solar subcells 68 and 70 are on the side of the first-layer substrate 62 closest to the sun, and the second-layer subcell 64 and buffer layer 66 are on the side of the first-layer substrate 62 furthest from the sun. A reason for using this architecture is that it may in some cases be difficult to deposit the buffer layer 66 or to deposit subcells 68 and/or 70 in the presence of the buffer layer 66. The placement of the second layer 64 and the buffer layer 66 on the opposite side of the substrate from the subcells 68 and 70 isolates the subcells 68 and 70 from the second layer 64 and the buffer layer 66. In practice, the buffer layer 66 and the second layer 64 are deposited on one side of the first-layer substrate 62, and then this structure is inverted in the deposition apparatus to deposit the subcell 68 and the subcell 70 (where present), as well as any additional subcells overlying the subcell 70. The subcells 68 and 70 may be lattice matched and epitaxial, so that no graded buffer layer is needed between them, or there may be a graded buffer layer between them as described in relation to other embodiments.

An example of the solar cell 60 of FIG. 13 includes a transparent GaAs substrate 62 as the first layer 62, a GaInAs second layer 64 having about 35 percent indium, and an AlGaInAs or GaInP(As) graded buffer layer 66 on the side of the first-layer substrate 62 remote from the incident sunlight 18. A GaAs additional solar subcell 68 and a GaInP additional solar subcell 70 are on the side of the first-layer substrate 62 closest to the sun. The GaAs additional solar subcell 68 and the GaInP additional solar subcell 70 are substantially lattice matched and epitaxial, so that no graded buffer layer is needed between the solar subcells 68 and 70.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A solar cell comprising:
   a first layer having a first-layer lattice parameter;
   a second layer having a second-layer lattice parameter different from the first-layer lattice parameter, wherein the second layer includes a photoactive second-layer material;
   a third layer having a third-layer lattice parameter different from the second-layer lattice parameter, wherein the third layer includes a photoactive third-layer material;
   a graded first buffer layer extending between and contacting the first layer and the second layer and having a first-buffer-layer lattice parameter that increases with increasing distance from the first layer toward the second layer; and
   a transparent graded second buffer layer extending between and contacting the second layer and the third layer and having a second-buffer-layer lattice parameter that decreases with increasing distance from the second layer toward the third layer.

2. The solar cell of claim 1, wherein the second buffer layer is of a different composition than the first buffer layer.

3. The solar cell of claim 1, wherein the second layer comprises a plurality of second-layer sublayers and wherein each of the second-layer sublayers has substantially the second-layer lattice parameter.

4. The solar cell of claim 1, wherein:
   the first layer is a nonphotoactive Ge substrate,
   the second layer includes $Ga_{1-X}In_XAs$, wherein X is from 0 to 0.53,
   the third layer includes GaAs,
   the first buffer layer includes graded GaInAs, and
   the second buffer layer includes transparent graded AlGaInAs.

5. The solar cell of claim 1, wherein:
   the first layer is a nonphotoactive Ge substrate,
   the second layer includes $Ga_{1-X}In_XAs$, wherein X is from 0 to 0.53,
   the third layer includes GaAs,
   the first buffer layer includes graded GaInAs, and
   the second buffer layer includes transparent graded AlGaInAs.

6. The solar cell of claim 1, further including:
   a fourth layer comprising a photoactive fourth-layer material above the third layer.

7. The solar cell of claim 6, wherein:
   the fourth layer has a fourth-layer lattice parameter different from the third-layer lattice parameter, and further including;
   a transparent graded third buffer layer extending between and contacting the third layer and the fourth layer and having a third-buffer-layer lattice parameter that matches that of the third layer where the third buffer layer contacts the third layer and matches that of the fourth layer where the third buffer layer contacts the fourth layer.

8. The solar cell of claim 6, further including:
   a fifth layer comprising a photoactive fifth-layer material above the fourth layer.

9. The solar cell of claim 7, wherein:
   the fifth layer has a fifth-layer lattice parameter different from the fourth-layer lattice parameter, and further including;
   a transparent graded fourth buffer layer extending between and contacting the fourth layer and the fifth layer and having a fourth-buffer-layer lattice parameter that matches that of the fourth layer where the fourth buffer layer contacts the fourth layer and matches that of the fifth layer where the fourth buffer layer contacts the fifth layer.

* * * * *